Jan. 18, 1966 B. G. BENDER 3,229,348

METHOD OF MAKING SEMICONDUCTOR DEVICES

Filed Feb. 24, 1961

Bob G. Bender,
*INVENTOR.*
*BY.*

Charles S. Daughey

*ATTORNEY.*

United States Patent Office 3,229,348 Patented Jan. 18, 1966

3,229,348
METHOD OF MAKING SEMICONDUCTOR DEVICES

Bob G. Bender, Garden Grove, Calif., assignor to Hughes Aircraft Company, Culver City, Calif., a corporation of Delaware Filed Feb. 24, 1961, Ser. No. 91,499
9 Claims. (Cl. 29—25.3)

This invention relates to semiconductor devices and the method for assembling them. More particularly the device comprises semiconductor material which in part serves as its own package and utilizes a second piece of semiconductor material, which may be a low grade, or polycrystalline, material, as a second part of the package.

In the making and encapsulating of semiconductor devices it is quite common to utilize packages which represent 80% of the total material cost and often requires several one-at-a time labor operations. In making very small semiconductor devices in a package of the order of .050" diameter and .030" thick, a severe problem is presented in reducing the encapsulation to a size approaching that of the semiconductor device. Many special problems are encountered, including matching thermal expansion characteristics of materials, bonding at successively lower temperatures and at temperatures which do not degrade or destroy the semiconductor device, and the many problems that are encountered in manipulating small parts in the subminiature size ranges particularly in the production of the devices having sizes of the order stated. It is accordingly an object and advantage of this invention to produce subminiature semiconductor devices utilizing device crystal material as a portion of the package therefor and avoiding many problems of material handling, bonding and processing and costs usually associated with subminiature devices.

The above and other objects and advantages of this invention will be apparent from the balance of this specification, disclosing a preferred embodiment of the invention, and in the accompanying drawings and claims forming a part thereof.

Figure 1:
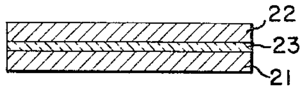
FIGS. 1 through 7 illustrate a sequence for manufacture of subminiature semiconductor devices.

The process as illustrated in FIGS. 1 through 7 of the drawings utilizes a first slice 21 of device grade semiconductor crystal material and a second slice 22 of crystal material of thermal expansion characteristics substantially the same as those of slice 21. The two slices 21, 22 are assembled in a sandwich as shown in FIG. 1 with a layer 23 of a bonding and insulating material, such as glass, therebetween and heated to form the bond. A device is subsequently formed in the interior of the sandwich and sealed therein. While this invention has application to a wide variety of semiconductor materials, it will be illustrated herein in silicon semiconductor material utilizing an initially N-type silicon crystal die and bonding P-type impurities thereto to form a PN junction diode.

In the preferred embodiment of this invention a wafer of N-type silicon semiconductor crystal material of .55 ohm centimeter grade and .005 inch thickness, as shown in FIG. 1 covered with a thin layer of insulating glass having matching thermal expansion characteristics such as for example Corning, No. 7160 glass manufactured by Corning Glass Co. This glass is preferably used in slice or sheet form, but other suitable glasses may be used in a slurry or powder form. The layer, or slice 23 of insulating glass is lapped to about .007 inch and is covered with a second slice 22 of low grade silicon semiconductor material having thermal expansion characteristics identical to those of the slice 21. A slice 22 preferably being discarded silicon material not otherwise useable for device manufacture. High dislocation density material, polycrystalline material, high or low resistivity material, or P or N-type impurity material may be used for the cover slice 22.

Figure 2:
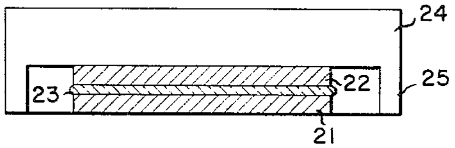
Figure 3:
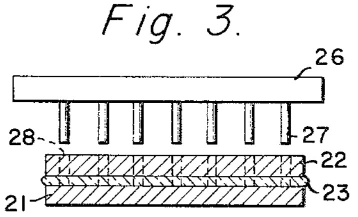

As shown in FIG. 2, the sandwich consisting of slices 21 and 22 with a glass 23 therebetween is covered by a weight 24 having offset legs 25 .020" in length and the assembly is heated to at least the softening point of the glass to compress the sandwich to .020" thickness and form a satisfactory bond. Some of the glass material will normally be compressed from between the sandwich slices and will be trimmed off in subsequent operations. As shown in FIG. 3, a gang drilling tool 26 having individual drills or rods 27 is used to drill holes through the covered silicon slice 22 to approximately the boundary of the glass 23 and the crystal slice 21. Ultrasonic drilling is preferred for this operation. A series of holes 28 is formed in the sandwich, and the bottom of the holes may be cleaned to expose clean crystal material from the slice 21 for subsequent device junction formation. The drilling operation may be stopped short of the crystal 21, a hydrofluoric acid etch used to remove the last bit of glass layer 23 and expose the silicon slice 21.

Figure 4:
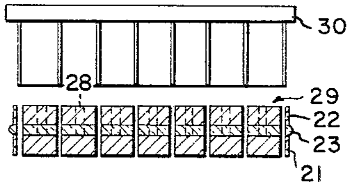

A second ultrasonic drilling tool of a "cookie cutter" design is illustrated in FIG. 4 for cutting the sandwich into individual pieces 29 each having a hole 28 centered therein.

Each piece 29 is then bonded on its exposed crystal 21 surface to a device lead or tab 31, which is preferably a Kovar tab having gold plating. on each side thereof. Since an ohmic contact is desired between the Kovar tab 31 and the crystal material 21, an N-type impurity such as .1 to .5% antimony or arsenic is incorporated into the gold clad material. The assembly of the sandwich portion of piece 29 to the tab 31 is then heated to bonding temperature to alloy the gold to the silicon.

Figure 5:
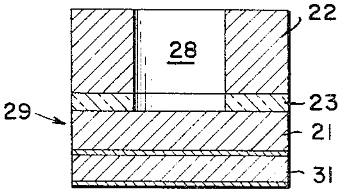
Figure 7:
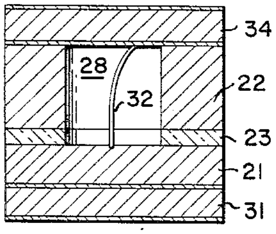
Figure 6:
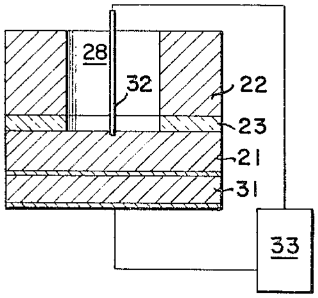

As shown in FIG. 6 a gold wire 32, containing a P-type impurity such as 2½% gallium or 1% boron (or, if preferred, an aluminum wire) is next pulse-bonded to the piece 29 of FIG. 5 on the exposed surface of the silicon slice 21 at the bottom of the hole in the piece 29. Box 33 in FIG. 6 represents a power source and timing apparatus for the pulse bonding operation.

The piece from the operation of FIG. 6 is assembled with its lead wire 32 laid across the exposed upper surface of the slice 22, with a gold and tin clad tantalum or molybdenum electrode 34 and heated to bonding temperatures to alloy the gold and tin layers on the tantalum electrode and the gold of the lead wire 32 to the crystal slice 22 to form the bonded assembly. The tantalum electrode cap is preferably bonded to the exposed semiconductor material slice 22 at a temperature substantially lower than the temperature at which the lower electrode 31 was bonded. For this reason the electrode 34 is preferably a molybdenum or tantalum material having a first clad film of gold on each of its larger surfaces and a second clad film of tin covering the gold films. The entire piece including the clad films is about 0.006" thickness. The tin and gold films form a low melting eutectic alloy with the silicon material of slice 22 at a temperature of about 325 to 360° C. and also melts and bonds to the end of the wire 32, dissolving the excess of the wire in the bonding process. The lower gold-tin-silicon bonding temperature is sufficiently below the gold-silicon eutectic temperature of 370° C. to avoid damage to the lower electrode bond previously formed. The resulting device comprises an assembly of portions of crystals 21 and 22 with an insulating bonding glass therebetween, Kovar and tantalum electrodes at opposing ends, and a gold lead wire forming a PN junction at the internal and protected surface of the crystal 21 and bonded to the tantalum electrode 34. In this way the electrical characteristics of the devices are determined by the PN junction of the lead wire 32 and the crystal slice 21 and is substantially independent of the external surface of the entire assembly.

Figure 8:
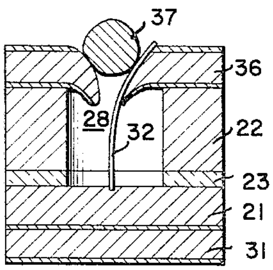
FIGS. 8 and 9 illustrate alternate steps useful in final sealing of the devices.
Figure 9:
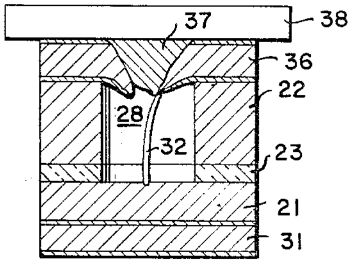

FIGS. 8 and 9 illustrate an alternate assembly method for sealing the device as produced in the pulse bonding step illustrated in FIG. 6. As shown in FIG. 8 the pierced tantalum electrode 36 is placed on the sandwich element 29 from FIG. 4 with the electrode 31, and both electrodes are bonded in one operation. No tin layer is needed on the electrode 36. The lead wire 32 is then inserted through the electrode 31 and pulse bonded through the hole 28 to the device crystal 21. The lead wire is laid on a side of the hole in the tantalum electrode cap and a dot, or sphere of solder material such as a gold tin alloy is placed in the recess, covered with a weight 38 and heated to bonding temperature. The solder sphere 37 is melted into the hole in the perforated cap 36 to seal the same, and to make electrical contact with the wire 38, completing a device about .030" in thickness A PN junction diode of opposite conductivity types may be produced using initially P-type, such as boron doped, silicon crystal 21, and a lead wire 32 of about 0.1 to 0.5% arsenic or antimony doped gold wire.

To make germanium crystal devices by the method herein disclosed, an N-type germanium crystal 21 may be used with gallium, indium, or boron alloyed with gold as a P-type doped gold lead wire 32. If a P-type germanium device crystal 21 is used, the gold lead wire 32 may contain arsenic or antimony as an N-type impurity. To match the thermal expansion characteristics of germanium, the glass layer 23 may be Corning 1826, manufactured by Corning Glass Co.

Other semiconductor crystal materials may be used with appropriate matching thermal expansion characteristic glass layer material. This process is particularly useful when it is desired to make use of very thin device crystals, because the low grade material in the sandwich forms sufficient physical support for thin crystals.

Devices made as above described contain a PN junction in a recess within the device structure, and utilize a sandwich comprising device grade crystal semiconductor material and low grade semiconductor material of matching thermal expansion characteristics as a major portion of the device package.

What is claimed is:

1. The method of making semiconductor PN junction devices, which comprises: bonding first and second semiconductor slices with an insulating and hermetic sealing material; forming a hole through the first slice and the sealing material to expose the inner surface of the second slice of semiconductor material; bonding an electrode comprising dopant material of opposite type to the second slice, to the exposed inner surface thereof to form a PN junction; and sealing the hole in the first slice with conducting material ohmically bonded to the electrode.

2. The method of making semiconductor PN junction devices, which comprises: bonding first and second semiconductor slices with an insulating and hermetic sealing material; forming a hole in the first slice and the sealing material to expose the inner surface of the second slice;

bonding an electrode to the exposed inner surface to form a PN junction; covering the first slice with an electrically conducting cap and bonding the other end of the electrode to the cap to form an ohmic contact between the electrode and cap and to hermetically seal the interior of the first slice.

3. The method of making semiconductor PN junction devices, which comprises: bonding first and second semiconductor slices with an insulating and hermetic sealing material; forming a hole in the first slice and the sealing material to expose the inner surface of the second slice; bonding first and second electrode caps to the exposed major surfaces of the first and second slices, the first electrode cap having an aperture therein in register with the hole in the first slice; inserting a doped electrode through said holes and bonding one end thereof to the second slice inner surface to form a PN junction therewith; and closing the hole in the first cap with bonding material to ohmically bond the other end of the electrode thereto and hermetically seal the interior holes.

4. The method of making semiconductor PN junction devices, which comprises: bonding first and second semiconductor slices with an electrically insulating and hermetic sealing material; forming a hole in the first slice and the sealing material to expose the inner surface of the second slice; bonding a first electrically conducting cap to the outer surface of the second slice at a first temperature; bonding an electrode to the exposed surface to form a PN junction; covering the first slice with an electrically conducting cap and bonding the other end of the electrode to the cap at a temperature lower than the first temperature to form an ohmic contact between the electrode and cap and to hermetically seal the interior of the first slice.

5. The method of making semiconductor PN junction devices, which comprises: bonding first and second silicon semiconductor slices with an electrically insulating and hermetic sealing glass having a coefficient of thermal expansion substantially equal to that of silicon; forming a hole in the first slice and the sealing material to expose the inner surface of the second slice; bonding a gold clad metal base electrode cap to the exposed surface of the second slice by heating to alloy the gold with the adjacent silicon; bonding an electrode to the exposed surface of the second slice to form a PN junction; and bonding a metal cap, clad with layers of gold and tin, to the exposed surface of the first slice and to the electrode at a temperature below 370° C. to make ohmic contact with the electrode, and to hermetically seal the electrode within the hole.

6. The method of making a plurality of semiconductor PN junction devices, which comprises: forming a layer structure by bonding first and second slices of a semiconductor material with an electrically insulating, hermetic sealing material, having a coefficient of thermal expansion substantially equal to that of the semiconductor material; forming a plurality of holes in the first slice and the sealing material to expose inner surface of the second slice; cutting the layered structure to form a plurality of layered elements each having one of the holes therein; bonding an electrode to the inner surface of the second slice to form a PN junction therewith; bonding an electrode cap to the first slice, over the hole, and to the electrode to make ohmic contact therewith and to hermetically seal the hole.

7. The method of making semiconductor PN junction devices, which comprises: bonding first and second slices of a semiconductor material with an electrically insulating and hermetic sealing material having a coefficient of thermal expansion substantially equal to that of the semiconductor material; mechanically forming a hole in the first slice and into, but not through the sealing material; chemically etching through the balance of the sealing material to expose into the hole the inner surface of the second slice; bonding an electrode to the exposed inner surface to form a PN junction therewith; and bonding an electrode cap to the first slice, over the hole, and to the electrode to make ohmic contact therewith and to hermetically seal the hole.

8. The method of bonding an electrode to semiconductor crystal material, which comprises: bonding first and second slices of a semiconductor material with glass having a coefficient of thermal expansion substantially that of the semiconductor material; bonding a metal electrode cap to the other side of the second slice; forming a hole through the first slice and through the bonding glass to expose the inner surface of the second slice; and bonding an electrode to the exposed inner surface.

9. The method of bonding an electrode to semiconductor crystal material, which comprises: bonding first and second slices of a semiconductor material with glass having substantially the coefficient of thermal expansion of the semiconductor material; forming a hole through the first slice and the bonding material to expose the inner surface of the second slice; and bonding an electrode to the exposed inner surface.

References Cited by the Examiner

UNITED STATES PATENTS

| | | | |
|---|---|---|---|
| 2,662,997 | 12/1953 | Christensen. | |
| 2,713,132 | 7/1955 | Matthews et al. | |
| 2,752,541 | 5/1956 | Losco | 317—235 |
| 2,796,563 | 6/1957 | Ebers et al. | 317—235 |
| 2,853,661 | 9/1958 | Houle et al. | 317—235 |
| 2,964,830 | 12/1960 | Henkels et al. | 29—25.3 |
| 3,002,133 | 9/1961 | Maiden et al. | 317—234 |
| 3,030,557 | 4/1962 | Dermit | 317—234 |
| 3,092,893 | 6/1963 | Cornelison et al. | 29—25.3 |

RICHARD H. EANES, Jr., *Primary Examiner.*

SAMUEL BERNSTEIN, JAMES D. KALLAM, *Examiners.*